(12) United States Patent
Nikolovski et al.

(10) Patent No.: US 12,289,109 B2
(45) Date of Patent: Apr. 29, 2025

(54) CURRENT AND/OR VOLTAGE PULSE SOURCE WITH RAPID RESPONSE TIME AND SUB-NANOSECOND JITTER

(71) Applicant: COMMISSARIAT A L'ENERGIE ATOMIQUE ET AUX ENERGIES ALTERNATIVES, Paris (FR)

(72) Inventors: Jean-Pierre Nikolovski, Saint-Paul-lez-Durance (FR); Driss Aboulkassimi, Saint-Paul-lez-Durance (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/391,290

(22) Filed: Dec. 20, 2023

(65) Prior Publication Data

US 2024/0213966 A1 Jun. 27, 2024

(30) Foreign Application Priority Data

Dec. 22, 2022 (FR) ...................................... 2214304

(51) Int. Cl.
*H03K 5/02* (2006.01)
(52) U.S. Cl.
CPC ..................... *H03K 5/02* (2013.01)

(58) Field of Classification Search
CPC ....................................................... H03K 5/02
USPC ............................................................ 327/303
See application file for complete search history.

(56) References Cited

U.S. PATENT DOCUMENTS 5,883,471 A * 3/1999 Rodman .................. H03K 3/53
315/200 A

FOREIGN PATENT DOCUMENTS

FR 2 093 320 A5 1/1972
KR 101 626 372 B1 6/2016

* cited by examiner

*Primary Examiner* — Tomi Skibinski
(74) *Attorney, Agent, or Firm* — BakerHostetler

(57) ABSTRACT

An electrical device for generating a test pulse, includes at least one voltage generator configured for generating an input voltage pulse in a first phase; for each generator, a coil transformer for amplifying the input voltage pulse; a rectifier diode; a target circuit comprising at least one target complex impedance and a capacitive element, the target circuit having a first electrode connected to the cathode of the rectifier diode and a second electrode; a trigger circuit configured for triggering a second phase by discharging the capacitive element through the target circuit so as to apply the test pulse to the target complex impedance.

13 Claims, 12 Drawing Sheets

CURRENT AND/OR VOLTAGE PULSE SOURCE WITH RAPID RESPONSE TIME AND SUB-NANOSECOND JITTER

CROSS-REFERENCE TO RELATED APPLICATION

This application claims priority to foreign French patent application No. FR 2214304, filed on Dec. 22, 2022, the disclosure of which is incorporated by reference in its entirety.

FIELD OF THE INVENTION

The invention relates to the production of a synchronous voltage or current pulse source with a high power and a duration of the order of nanoseconds. More particularly, the invention relates to the generation of current pulses for the performance of electromagnetic compatibility tests using inductive loads or high-overvoltage voltage pulses for supplying capacitive loads such as piezoelectric loads and resistive loads.

BACKGROUND

For testing electronic devices and/or components that are subjected to electrostatic discharges and that are to be exposed to high voltage, continuous voltage and/or current sources are normally used to generate test stimuli. However, the application of continuous high-amplitude continuous voltages or currents presents risks of electrification for the operator performing the test, as well as a risk of damaging the target device.

Thus there is a need to provide a high-intensity or high-voltage current source that can limit the operator's exposure in time and space to the risks of electrification. The aforesaid safety problems may be partially resolved by using pulse generators. However, this type of pulse source currently exhibits maximum ascending and descending transition slopes of 250 V/ns and 4 A/ns in the high voltage and current domains respectively.

More particularly, tests of compatibility and resistance to electromagnetic pulses (CEM tests) require the production of wide-band electromagnetic pulses having a very short duration (of the order of a few nanoseconds) and high power. This type of test may be used in a number of fields of application, such as on-board electronic systems, mobile telephones, motor vehicles, avionics or magnetic memories, particularly their resistance to magnetic pulses.

In the context of the invention, "jitter" is taken to mean the period between the rising edge of a low-voltage pulsed input signal of the source and the rising edge of the high-voltage or high-current output pulse applied to the component to be tested.

In the context of the invention, "electrical parameter" is taken to mean a parameter chosen from a voltage, a current and a variation of a current over time (the slope di/dt).

Known high-voltage pulse generators are characterized by jitter between the trigger signal and the pulse produced, which is not controlled when attempts are made to exceed the voltage and current amplitudes provided by prior art solutions. In this case, the jitter may be as much as several nanoseconds. The random aspect of the jitter creates uncertainties in the results of tests performed, notably, on the fastest components.

Furthermore, known pulse generators used for CEM tests have maximum pulse currents of the order of 30 A in short circuit, and voltages with a maximum of 1500 V in open circuit.

Thus the aim is to provide a pulse source of voltage, current, or temporal variation of current having a minimized jitter of less than one nanosecond, in order to improve the characterization of circuits. Furthermore, an additional aim is that of limiting the safety risks for operators by limiting the use of high amplitudes of said electrical parameters in space and time. More generally, the solution according to the invention is intended to provide test pulses of electrical stimulation that tend toward a Dirac peak.

Response to the Problem and Provision of Solution

In order to overcome the limitations of the existing solutions as regards the risks of electrocution, uncontrolled jitter and the control of the pulse characteristics, the invention proposes an electronic device for generating a test pulse capable of reaching greater amplitudes of current and voltage than the known solutions, with controlled temporal variation curves and a jitter of less than one nanosecond. The device according to the invention is based on a first phase of transformation and storage of energy obtained from a low-voltage, high-power voltage generator, and a second phase of abrupt, rapid discharge of at least some of the electric energy stored in the target electronic component, in such a way that a peak of the electronic parameter is obtained. The peak is brief and intense, thus resembling a Dirac peak. In the context of the invention, the discharge step may be controlled by control means or may be spontaneous beyond a certain voltage threshold. Thus the invention makes it possible to increase the available power by simultaneously providing a pulse source of high voltage (up to several thousand volts, for example 2000 V) and a high output current (up to several tens of amperes, for example 50 A). The invention also enables the reliability of the tests to be improved, because it reduces the jitter by comparison with the known solutions.

The invention is also compatible with a number of fields of application such as:
  Testing the pulsed response of a piezoelectric transducer whose intrinsic capacitance forms the main load impedance in the field of acoustics and MEMS. In this case, the chosen electronic parameter is the voltage.
  Producing pulsed magnetic fluxes that are monopolar or bipolar or with damped resonance, in inductive elements, for the performance of electromagnetic compatibility (CEM) tests or tests of resistance to electromagnetic pulses.
  High-frequency sampling of magnetic fields or currents by generation of pulsed Lorentz forces.
  Excitation of wideband transducers and the study of the pulsed electromagnetic responses in electromagnetic cavities.
  Tests of resistive loads for thermoacoustic applications for generating wideband acoustic waves by the production of pulsed thermal expansion.

SUMMARY OF THE INVENTION

The invention proposes an electrical device for generating a test pulse of an electrical parameter chosen from among a current, a voltage or the time derivative of a current, said electrical device comprising:
  at least one voltage generator configured for generating an input voltage pulse in a first phase;

for each generator, a coil transformer for amplifying the input voltage pulse, the coil transformer having a primary winding connected in parallel with the associated generator and a secondary winding having a first end and a second end;
a rectifier diode having an anode connected to the second end of the secondary winding and having a cathode;
a target circuit comprising at least one target complex impedance and a capacitive element, the target circuit having a first electrode connected to the cathode of the rectifier diode and a second electrode;
a trigger circuit configured for triggering a second phase by discharging said capacitive element through the target circuit so as to apply the test pulse to the target complex impedance.

According to a particular aspect of the invention, the target circuit further comprises a resistive element and an inductive element, connected in series with the capacitive element, the target complex impedance being chosen from among any of said elements.

According to a particular aspect of the invention, the electrical device further comprises a storage capacitance mounted between the cathode of the rectifier diode and the electrical ground for storing at least some of the electric energy supplied by the secondary winding.

According to a particular aspect of the invention, the trigger circuit comprises:
a trigger transistor connecting the second electrode to the electrical ground;
control means configured to generate a trigger signal for keeping the trigger transistor in the blocking state during the first phase, and for putting the trigger transistor in the conducting state during the second phase, so as to activate the discharge of the storage capacitance into the complex impedance.

According to a particular aspect of the invention, the trigger circuit comprises:
a trigger transistor connecting the first electrode to the electrical ground, the second electrode being connected to the electrical ground;
control means configured to generate a trigger signal for keeping the trigger transistor in the blocking state during the first phase, and for putting the trigger transistor in the conducting state during the second phase, so as to activate the discharge of the capacitive element into the target complex impedance.

According to a particular aspect of the invention, the trigger circuit further comprises a breakdown switch component comprising:
a first conducting wire connected to the first electrode of the complex load impedance;
a second conducting wire connected to the second electrode of the complex load impedance;
the first and second conducting wires being separated at a first distance of not more than 1 mm by a dielectric volume; the breakdown switch component is conducting only when the voltage between the first conducting wire and the second conducting wire exceeds a first predetermined threshold, the first predetermined threshold depending on the first distance.

According to a particular aspect of the invention, the breakdown switch component further comprises an adjusting micro-screw fixed to the second conducting wire for controlling the first distance.

According to a particular aspect of the invention, the trigger circuit further comprises:
a metallic layer placed at a second distance from the dielectric volume, the second distance being not more than 1 mm;
a light-emitting diode connected between the generator and the electrical ground and placed so as to emit a light ray onto the metallic layer when the input voltage pulse is generated.

According to a particular aspect of the invention, the trigger circuit further comprises a gas discharge tube connected in parallel with the target circuit; the gas discharge tube is conducting only when the voltage at these terminals exceeds a second predetermined threshold.

According to a particular aspect of the invention, the electrical device further comprises a short-circuit diode connected in parallel with the series formed by the resistive element and the inductive element.

According to a particular aspect of the invention, the electrical device further comprises a Zener diode connected in the reverse direction from the cathode of the rectifier diode, the Zener diode being connected in series with the resistive element and the inductive element, the series formed by the resistive element and the inductive element and the Zener diode being connected in parallel with the short-circuit diode.

According to a particular aspect of the invention, the target complex impedance is the capacitive element corresponding to a piezoelectric transducer. The electrical parameter is the voltage at the terminals of the capacitive element. The test pulse amplitude is greater than 250 V; the variation of the voltage during a rising and/or falling edge of the pulse is between 1 V/ns and 500 V/ns.

According to a particular aspect of the invention, the target complex impedance is the inductive element corresponding to a Lorentz force generator. The inductance of the target inductive element is less than 5 nH. The electrical parameter is the electric current through the inductive element. The test pulse amplitude is between 1 A and 100 A.

According to a particular aspect of the invention, the target complex impedance is the inductive element corresponding to a magnetic flux generator. The inductance of the inductive element is between 5 nH and 1 µH, or possibly up to 10 µH. The electrical parameter is the time derivative of the current through the inductive element. The test pulse amplitude is between 1 A/ns and 400 A/ns.

BRIEF DESCRIPTION OF THE DRAWINGS

Other characteristics and advantages of the present invention will become more apparent in the light of the following description, relating to the following attached drawings.

DETAILED DESCRIPTION

Figure 1A:
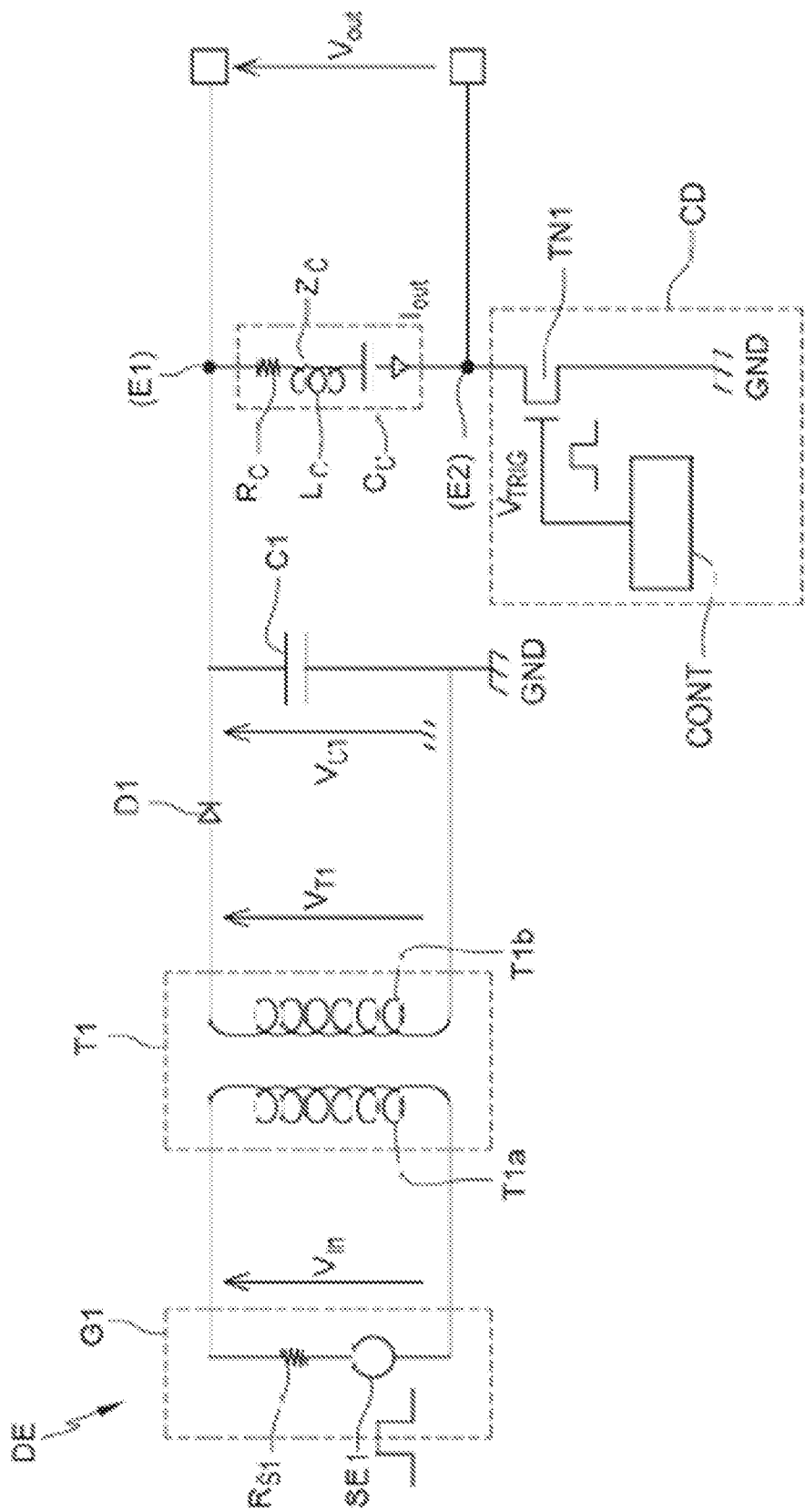
FIG. 1a shows the electrical diagram of the electrical device according to a first embodiment of the invention.

FIG. 1a shows the electrical diagram of the electrical device DE according to a first embodiment of the invention. The electrical device DE is configured to generate a test pulse of an electrical parameter chosen from among a current $I_{out}$, a voltage $V_{out}$ and the time derivative of a current $dI_{out}/dt$, depending on the field of application and the nature of the test to be performed. The electrical device DE comprises a voltage generator G1 configured to generate an input voltage pulse $V_{in}$; a coil transformer T1; a rectifier diode D1; a target circuit comprising at least one target complex impedance Zc to be tested; and a trigger circuit CD.

The voltage generator G1 supplies an input voltage pulse $V_{in}$ with an amplitude of between 25 V and 400 V, preferably between 60 V and 100 V. The duration of the input voltage pulse $V_{in}$ is between 25 ns and 1000 ns, preferably less than 500 ns. The 20%-80% rise time of the input voltage pulse $V_{in}$ is less than 10 ns.

The voltage generator G1 has an output impedance of less than 2Ω. Thus the voltage generator G1 can supply a short-circuit current of at least 50 A. The voltage generator G1 is configured to generate an input voltage pulse $V_{in}$ during a first phase φ1, called the charging and energy transfer phase. The procedure of the first phase φ1 is detailed in a later section.

The coil transformer T1 is configured to amplify the input voltage pulse $V_{in}$. The coil transformer T1 comprises a primary winding T1a connected in parallel with the generator G1 and a secondary winding T1b. The secondary winding T1b comprises a first end connected to the electrical ground GND and a second end. The amplified pulse $V_{T1}$ at the output of the transformer is the voltage between the first end and the second end of the secondary winding T1b. The transformer has a transformation factor of between 10 and 18, or even up to 30. Thus the amplitude of the amplified pulse $V_{T1}$ is between 250 V and 2000 V, or even up to 2500 V, allowing for the losses in the transformer T1.

By way of example, the transformer T1 has a low number of turns, comprising 5 turns for the primary winding T1a and 50 turns for the secondary winding T1b. The turns are wound around a wide-band soft iron ferrite alloy rod or core of the Ni—Zn or Mn—Zn type. The ferrite core has a diameter of between 0.75 mm and 1 cm. This design enables the spatial compactness of the electrical device DE to be improved. The advantage of choosing ferrite materials is that a constant relative magnetic permeability μr is maintained up to frequencies of 50 MHz. Additionally, a transformer T1 with a low number of turns limits the input impedance associated with the primary winding and thus absorbs a high pulsed current and power. This makes it possible to exploit the low output impedance of the low voltage pulse generator G1.

The rectifier diode D1 has a cathode and an anode connected to the second end of the secondary winding T1b. The rectifier diode D1 is then mounted in the direction in which it conducts from the second end of the secondary winding T1b. The rectifier diode D1 enables the amplified pulse $V_{T1}$ to be converted into a DC voltage having an amplitude that is amplified relative to the input voltage pulse $V_{in}$. The rectifier diode D1 has a reverse recovery time $T_{rr}$ that is less than or equal to 75 ns. For a given transformation ratio, the increase in the number of turns of the transformer T1 enables the response time τ of said transformer T1 to be increased. The response time τ is greater than the reverse recovery time $T_{rr}$ of the rectifier diode D1.

The target circuit comprises at least one target complex impedance Zc to be tested and a capacitive element $C_c$. By way of non-limiting example, the target circuit is an RLC series circuit formed by a resistive element Ro, an inductive element $L_c$ and the capacitive element $C_c$. The target circuit has a first electrode E1 and a second electrode E2. The first electrode E1 is connected to the cathode of the rectifier diode D1. In the illustrated example, the target complex impedance Zc is the inductive element $L_c$.

The electrical device DE further comprises a storage capacitance C1 mounted between the cathode of the rectifier diode D1 and the electrical ground GND for storing at least some of the electric energy supplied by the secondary winding T1b.

The trigger circuit CD is configured to trigger a second phase φ2, called the discharge phase. Said second phase φ2 consists in discharging the capacitive element $C_c$ or the storage capacitance C1 through the RLC target circuit, and more particularly through the inductive impedance Le to be tested, in such a way that the test pulse is applied to the target complex impedance Zo. The trigger circuit CD comprises a transistor TN1 connected in series between the second electrode E2 and the electrical ground GND and a control circuit CONT for controlling the gate of the transistor TN1.

Figure 1B:
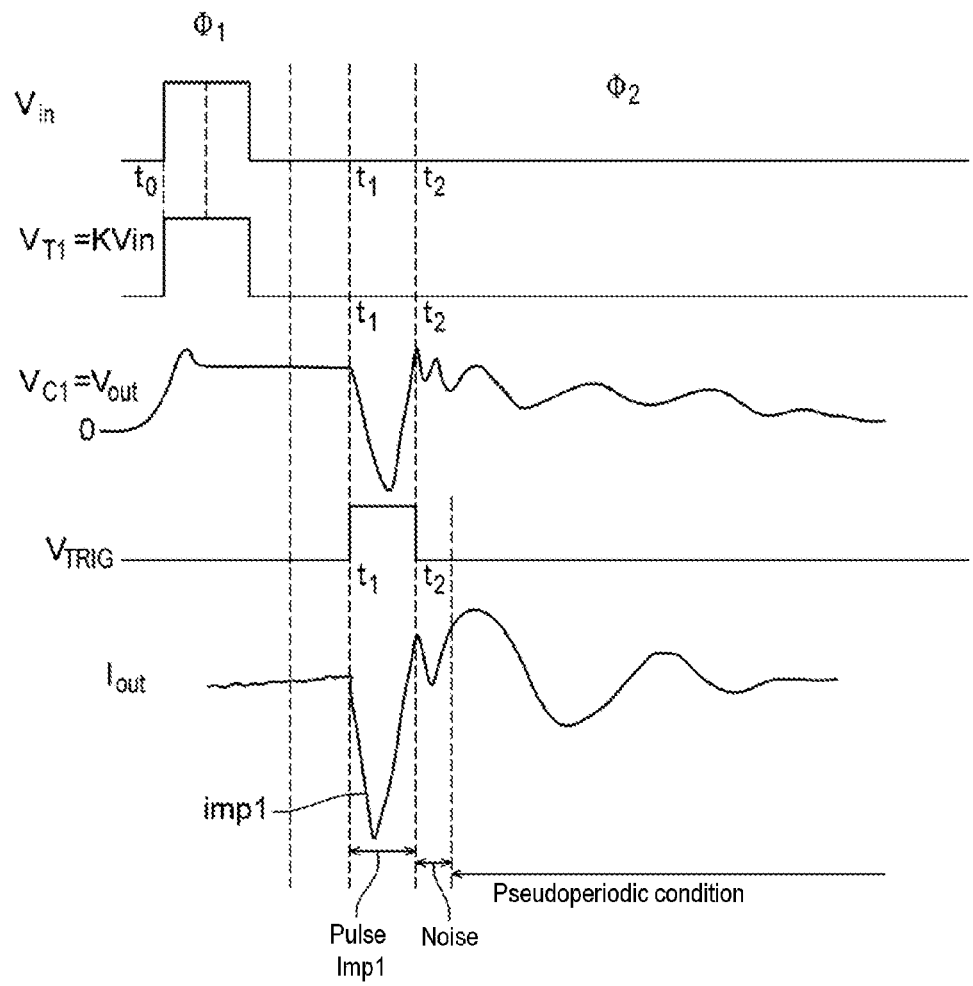
FIG. 1b shows a flow diagram of the voltages in the nodes of the electrical device according to the first embodiment of the invention.

FIG. 1b shows a flow diagram of the voltages in the nodes of the electrical device DE according to the first embodiment of the invention. To simplify the illustration of the operation of the electrical device DE, the flow diagram is not drawn to scale.

In the first phase φ1, the voltage generator G1 generates an input voltage pulse $V_{in}$ having an amplitude of between 25 V and 120 V. The coil transformer T1 generates an amplified pulse $V_{T1}$ with an amplification factor of not more than 10. In the first phase φ1, the control circuit CONT is configured to keep the trigger transistor TN1 in the blocking state via the trigger signal $V_{TRIG}$ applied to the gate of said transistor TN1. This enables the electrical path between the node E2 and the electrical ground to be cut. Consequently the electric energy from the transformer T1 is transferred and stored by the charging of the storage capacitance C1. The potential at the node E1 increases progressively with a slope of more than 6 V/ns. At the end of the first phase φ1, the potential at the node E1 is established at a constant voltage with an amplitude of between 250 V and 1200 V. The limitation to a value of 1200 V ensures that the maximum drain-source voltage of the transistor TN1 is not exceeded. By increasing the value of the storage capacitance C1 it is possible to modulate the slope to the voltage at the node E1 in the first phase φ1. As the capacitance C1 increases, the slope becomes slower during charging.

The second phase φ2 is triggered at t1 by the generation of a pulse via the trigger signal $V_{TRIG}$ on the gate of the transistor TN1. The trigger signal pulse $V_{TRIG}$ is between 3 V and 20 V. The transistor TN1 switches to a conducting state and the connection between the circuit $R_cL_cC_c$ and the ground is established. This causes an abrupt and rapid discharge of the storage capacitance C1 into the target circuit, and more particularly into the target impedance Zc (the inductance $L_c$ in this case). This creates a voltage pulse $V_{out}$ and/or a current pulse $I_{out}$ in the target impedance Zc between t1 and t2. A noise then appears, followed by a damped pseudoperiodic discharge condition. The maximum current $I_{out}$ and the damping of the discharge are controlled by the resistance $R_c$. The slope of the falling edge of the pulse produced Imp1 depends on the conductivity of the transistor TN1 in the conducting state, but also on the design of the components of the target circuit. The width of the pulse Imp1 is equal to half a natural period of the discharge into the target circuit $R_cL_cC_c$. Thus the duration of the test pulse is determined by the choice of the value of the inductance Lc and the capacitance Cc. The response time of the transistor TN1 must be less than a quarter of the natural period of the target circuit $R_cL_cC_c$.

Advantageously, the oscillations of the damped pseudoperiodic condition can be suppressed by making the damping factor of the circuit $R_cL_cC_c$ equal to or greater than 0.7.

Advantageously, the discharge slope of the capacitive element $C_c$ can be slowed by adding a resistance connected in parallel with said capacitive element $C_c$ and typically rated at between 100 kΩ and 10 MΩ, or preferably around 1 MO. Said resistance may alternatively be connected in parallel with the storage capacitance C1.

By way of example, the result is a fast current pulse Imp1 with a temporal variation of 6 A/ns and a maximum strength of 40 A, using the following design: $V_{C1}$=600 V, $C_c$=1.1 nF; $L_c$=100 nH, $R_c$=6Ω.

Figure 1C:
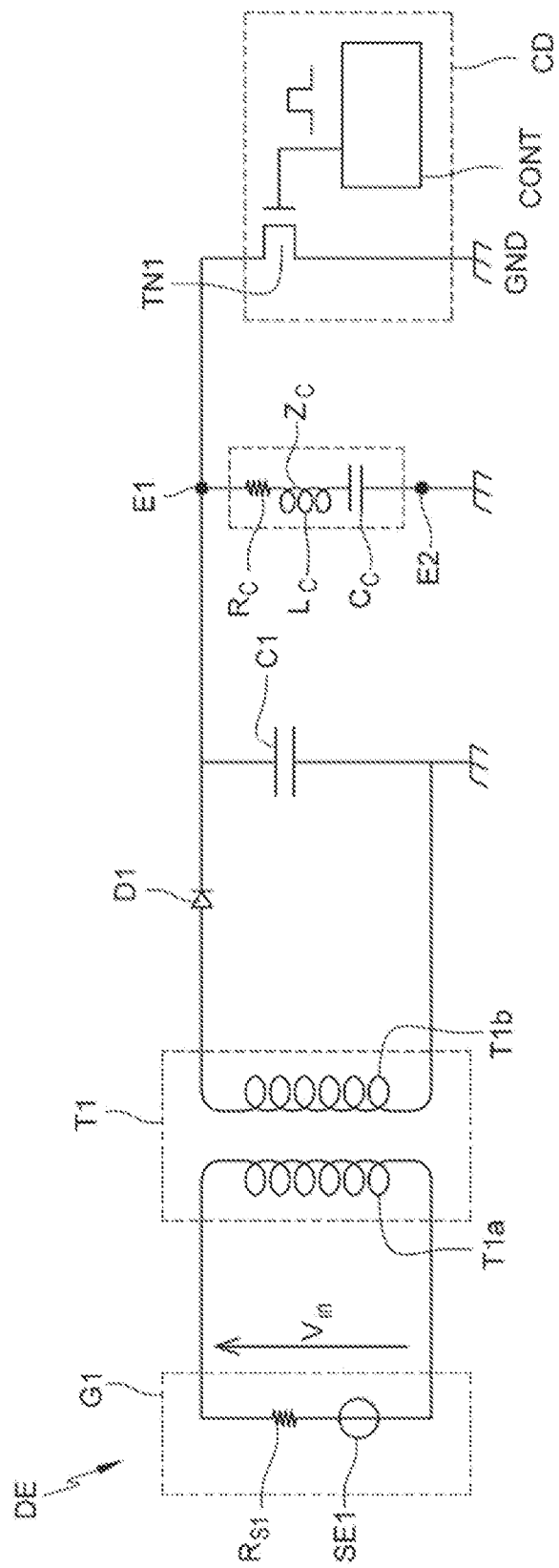
FIG. 1c shows the electrical diagram of the electrical device according to a second embodiment of the invention.

FIG. 1c shows the electrical diagram of the electrical device DE according to a second embodiment of the invention. The second embodiment differs from the first embodiment in the fitting of the trigger circuit CD. This is because the transistor TN1 is mounted between the first electrode E1 and the electrical ground GND. The target circuit $R_cL_cC_c$ is mounted between the cathode of the rectifier diode D1 and the electrical ground GND. The change of connection causes a change in the operation of the electrical device DE. The use of the storage capacitance is optional in the second embodiment. In the first phase φ1, the capacitive element $C_c$ is charged by the amplified pulse obtained from the transformer T1. In the second phase φ2, the control circuit CONT is configured to apply a pulse via the trigger signal $V_{TRIG}$ to the gate of the transistor TN1. The transistor TN1 switches to a conducting state, and the target circuit $R_cL_cC_c$ is short-circuited. This causes an abrupt and rapid discharge of the capacitive element $C_c$ into the target circuit itself, and more particularly into the target impedance Zc (the inductance $L_c$ in this case). This produces a voltage pulse $V_{out}$ or a strong current discharge pulse $I_{out}$ in the target impedance Zc from the instant t1, with a maximum duration determined by the time interval between t1 and t2, having characteristics similar to what was described above.

Figure 1D:
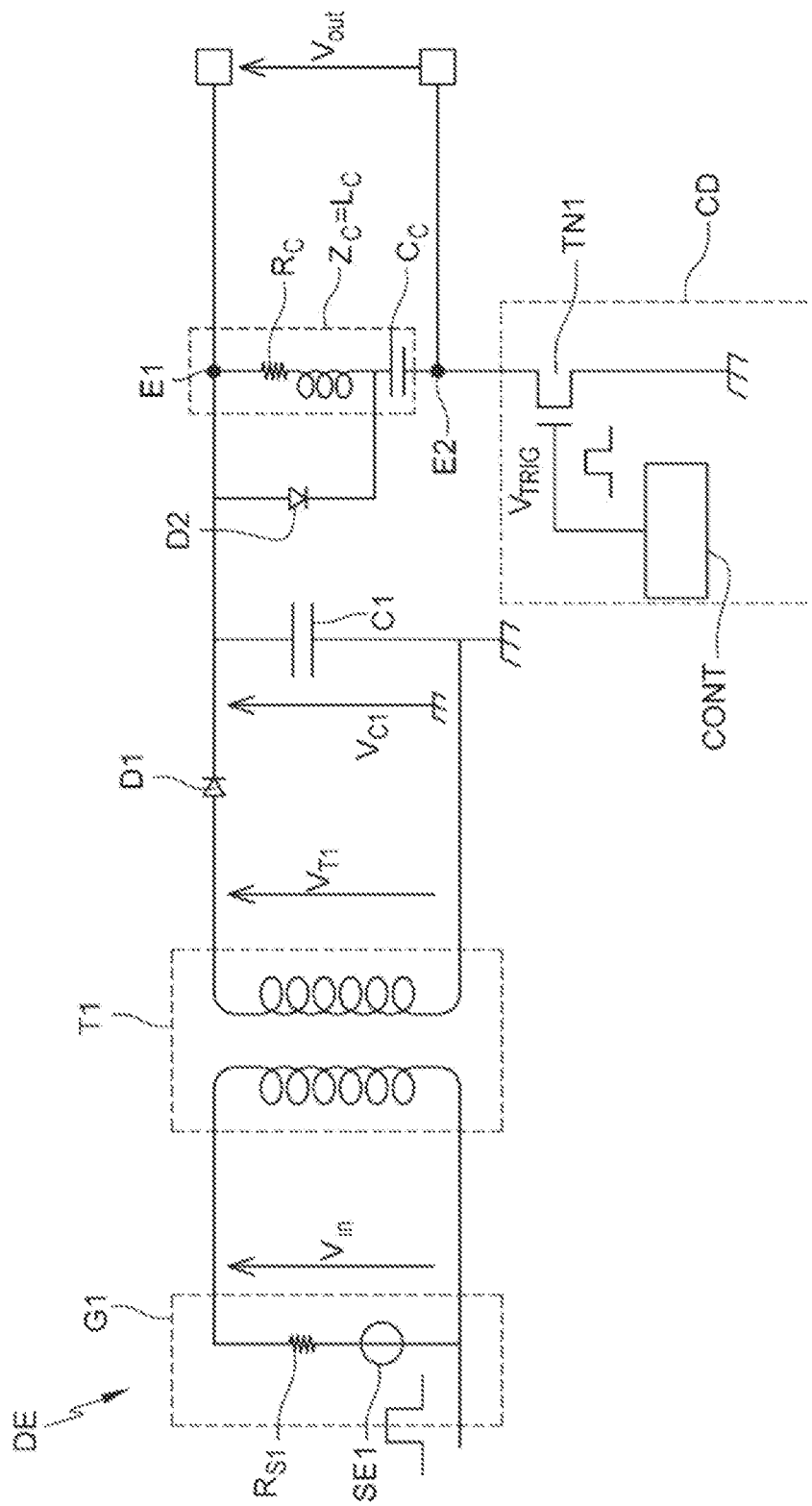
FIG. 1d shows the electrical diagram of the electrical device according to a third embodiment of the invention.

FIG. 1d shows the electrical diagram of the electrical device according to a third embodiment of the invention. The third embodiment differs from the first embodiment by the addition of a short-circuit diode D2. The short-circuit diode D2 is connected in parallel with the assembly formed by the resistive element $R_c$ and the inductive element $L_c$. The short-circuit diode D2 is in the direct direction relative to the current generated by the secondary winding T1b toward the capacitive element $C_c$. The increase in the resistance of the resistive element Re enables the voltage at the terminals of said resistive element $R_c$ to be increased, during the first phase φ1, to a value greater than the threshold voltage of the short-circuit diode D2. The current supplied by the secondary winding can then be routed through the short-circuit diode D2 instead of the inductive element $L_c$ during charging in the first phase φ1. This makes it possible to avoid the radiation of the inductive element $L_c$ in the charging phase φ1, which represents a source of noise.

Moreover, in the second phase φ2, the short-circuit diode D2 enables the oscillations to be eliminated in the damped pseudoperiodic condition. Thus it is only the current or voltage pulse Imp1 that is obtained.

Figure 1E:
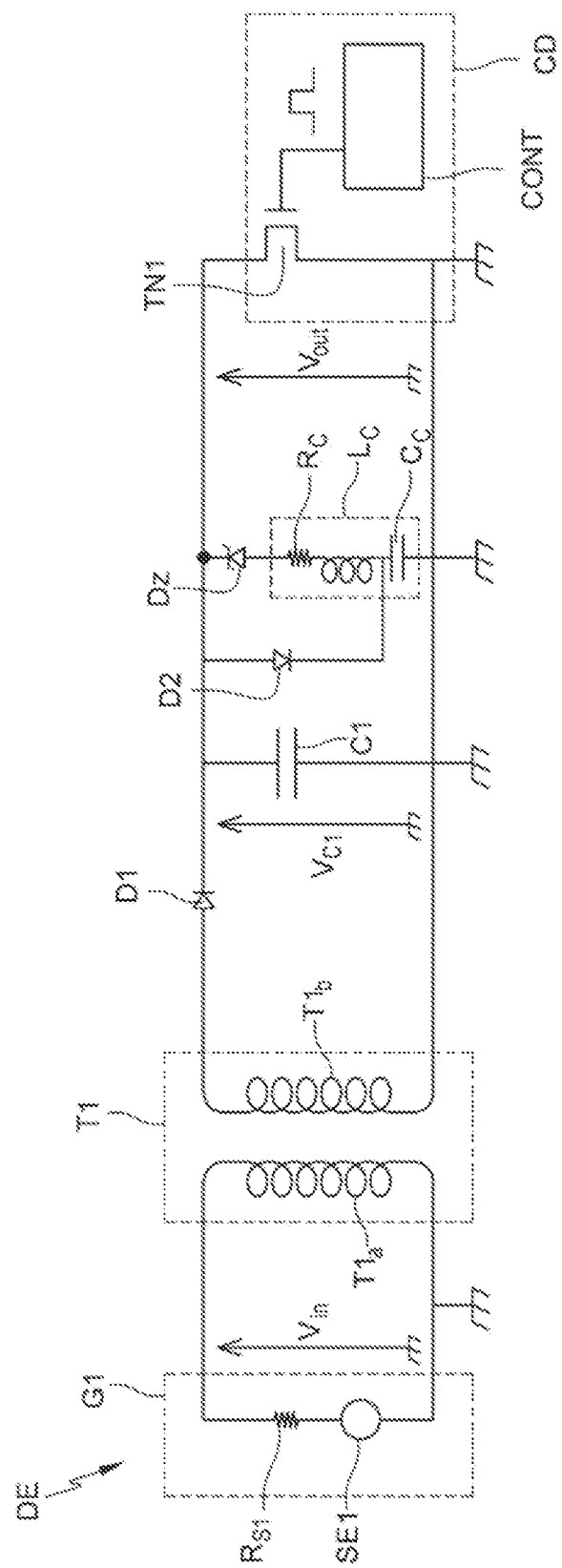
FIG. 1e shows the electrical diagram of the electrical device according to a fourth embodiment of the invention.

FIG. 1e shows the electrical diagram of the electrical device DE according to a fourth embodiment of the invention.

The electrical device DE further comprises a Zener diode Dz connected in the reverse direction from the cathode of the rectifier diode D1. The Zener diode Dz is connected between the cathode of the rectifier diode D1 and the first electrode E1 of the target circuit $R_cL_cC_c$. The series branch formed by the resistive element $R_c$ and the inductive element $L_c$ and the Zener diode Dz is connected in parallel with the short-circuit diode D2.

Alternatively, the Zener diode is connected in series between the inductive element $L_c$ and the resistive element $R_c$. The series branch formed by the resistive element $R_c$ and the inductive element $L_c$ and the Zener diode Dz is connected in parallel with the short-circuit diode D2.

Advantageously, the Zener diode Dz is a one-way transient suppression diode. The Zener diode Dz has a blocking ("clamping") voltage greater than the turnover voltage of the short-circuit diode D2. Additionally, the Zener diode Dz has a low reverse voltage capacitance (around 10 pF) relative to that of the capacitive element $C_c$ (usually more than 100 pF).

By incorporating the Zener diode, it is possible to prevent a flow of current in the inductive element $L_c$ in the first phase φ1, thereby preventing the creation of noise by radiation of the inductive element $L_c$.

In general terms, the use of the short-circuit diode D2 as detailed above is compatible with all the embodiments of the invention. Furthermore, the use of the Zener diode Dz as detailed above is compatible with all the embodiments of the invention.

Figure 2A:
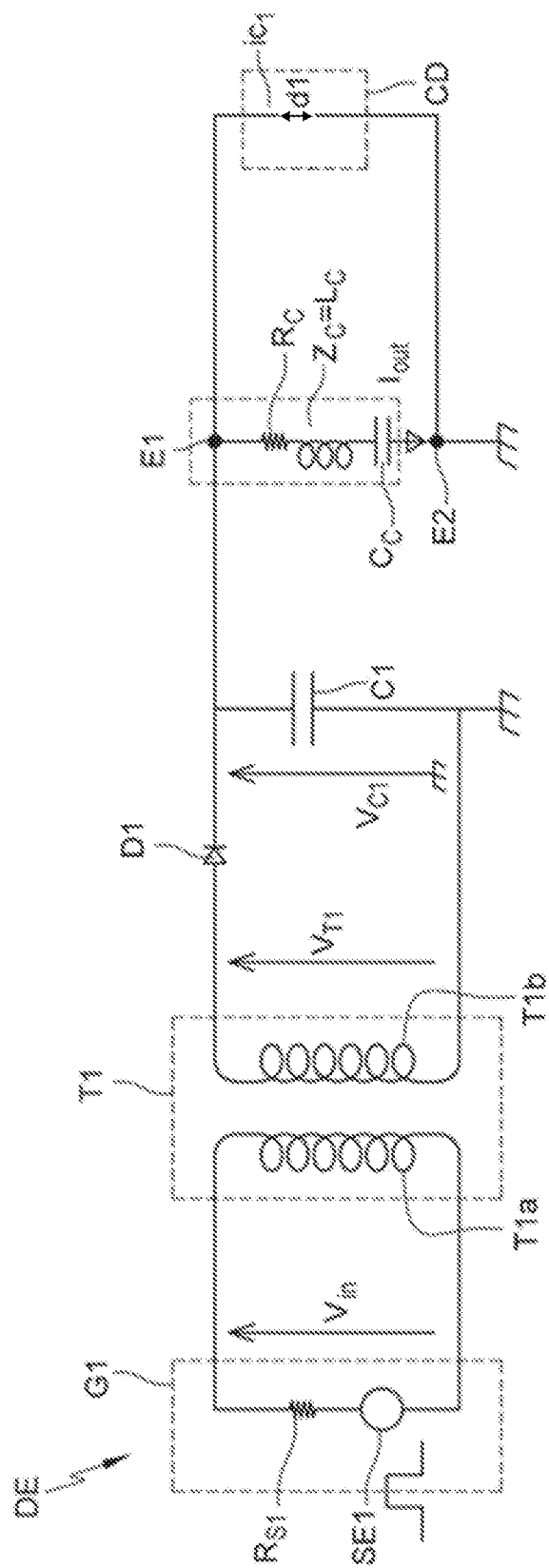
FIG. 2a shows the electrical diagram of the electrical device according to a fifth embodiment of the invention.

FIG. 2a shows the electrical diagram of the electrical device DE according to a fifth embodiment of the invention. The fifth embodiment differs from the second embodiment in the implementation of the trigger circuit CD. The trigger circuit CD is a breakdown switch component ic1 comprising, on the one hand, a first conducting wire connected to the first electrode E1 of the complex load impedance Zc, and, on the other hand, a second conducting wire connected to the second electrode E2 of the complex load impedance Zc and to the electrical ground GND. The first and second conducting wires are separated by a distance d1 which is not greater than 1 mm. Preferably, at least one of the conducting wires is associated with an electrode fixed to a deformable support. Advantageously, and optionally, the assembly is hermetically sealed to provide moisture-proofing. The separating space is occupied by a volume of material or a dielectric gas. The breakdown switch component ic1 is conducting only when the voltage between the first conducting wire and the second conducting wire exceeds a first predetermined threshold, called the breakdown voltage. The breakdown voltage depends on the first distance d1. The breakdown voltage is between 100 V and 1000 V and preferably 10% to 30% lower than the maximum output voltage of a transformer T1. Thus, in the first phase φ1, the voltage at the node E1 increases progressively after the application of the input voltage pulse $V_{in}$ as described above. The capacitive element $C_c$ is charged progressively in this phase. When the voltage at the node E1 exceeds the breakdown voltage, the breakdown switch component ic1 suddenly becomes conducting.

The target circuit $R_cL_cC_c$ is thus short-circuited, and the capacitive element $C_c$ is discharged into the target inductive element $L_c$. Thus the breakdown initiates the triggering of the second phase ϕ2 spontaneously and without worsening the jitter by comparison with the embodiments using a transistor TN1.

The temporal variation of the current through the inductive element $L_c$ at the moment when the second phase ϕ2 is triggered is expressed by the following equation:

$$\frac{dIout}{dt}(t1) = \frac{-V0}{Lc}$$

where V0 is the electrical potential at the node E1 of the target circuit $R_cL_cC_c$ at the instant of breakdown. Thus the slope of the test pulse Imp1 can be controlled by modifying the following two parameters: the impedance of the inductive element $L_c$ and the breakdown voltage V0 of the breakdown switch component ic1.

The triggering by breakdown makes it possible to achieve current and voltage pulses having amplitudes and slopes of variations that are higher than the amplitudes and slopes of the embodiments using a transistor TN1. The breakdown switch component ic1 is a more robust solution that absorbs most power when exposed to high voltages and currents. Using a single transformer, it is thus possible to generate test voltage pulses with an amplitude of more than 1000 V and with a variation of more than 10 V/ns in rise time and 500 V/ns in fall time. It is also possible to generate current test pulses with a peak amplitude exceeding 50 A and/or a variation of 50 A/ns.

Advantageously, the breakdown switch component ic1 has a modulable breakdown voltage. The breakdown switch component ic1 further comprises an adjusting micro-screw fixed to the second conducting wire connected to the electrical ground GND, to control the distance d1. By controlling the distance d1, it is possible to modify the breakdown voltage V0. By modifying the breakdown voltage V0, it is possible to control the slope of the pulse Imp1 obtained following the triggering of the discharge by breakdown. The adjusting micro-screw has a thread with a metric pitch of not more than 0.35 mm. Thus one hundredth of a turn of the screw is equivalent to an advance of 3.5 µm toward the first conducting wire. According to Paschen's law, this results in a decrease of 10 V in the breakdown voltage V0 per hundredth of a turn of the adjusting micro-screw. This variation may be reduced even farther by inserting a spring element which, for a given translation of the adjusting screw, gives rise to an opposing force due to the stiffness of the spring. According to a variant, the adjusting micro-screw acts on the wall of the deformable support fixed to the second conducting wire, for example a support made of Kapton or a thin printed circuit made of FR4 material to which is soldered a pin forming the electrode of the second conducting wire. The separating distance d1 may vary from 0 to 1 mm with an adjustment pitch of not more than 1 µm. This provides more precise control of the breakdown voltage V0 with a variation step of not more than 1 V. This then enables the slope of the current test pulse Imp1 to be precisely modulated.

Figure 2B:
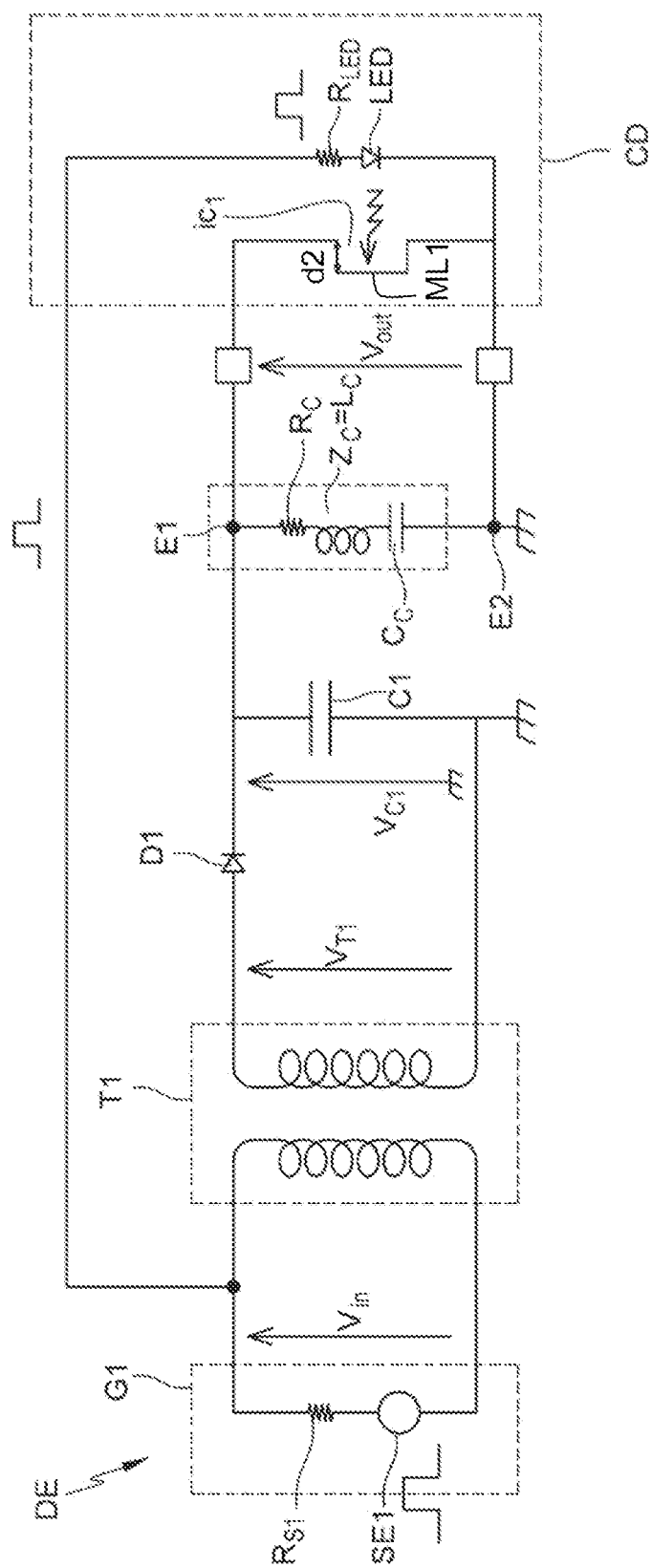
FIG. 2b shows the electrical diagram of the electrical device according to a sixth embodiment of the invention.

FIG. 2b shows the electrical diagram of the electrical device DE according to a sixth embodiment of the invention. The sixth embodiment incorporates all the characteristics of the fifth embodiment. The trigger circuit CD further comprises a metallic layer ML1 placed at a second distance d2 from the dielectric volume of the breakdown switch component ic1, and a light-emitting diode LED capable of emitting ultraviolet rays. The second distance d2 is not more than 1 mm. By way of example, the metallic layer ML1 is a sheet of zinc. The light-emitting diode LED is connected between the output of the generator G1 and the electrical ground GND. A resistance RLED is connected in series between the light-emitting diode LED and the output of the generator G1, in order to limit the current passing through said light-emitting diode to a strength of not more than 500 mA.

The light-emitting diode LED is placed so as to emit an ultraviolet ray onto the metallic layer ML1. The emission of the ultraviolet ray is then activated by the input voltage pulse $V_{in}$. This produces a light pulse synchronized with the input voltage pulse $V_{in}$. Thus the light-emitting diode LED illuminates the surface of the metallic layer ML1 in a synchronized pulsed manner. This causes electrons to be detached from the metallic layer ML1 by the photoelectric effect. Thus the pulsed UV illumination promotes the breakdown of the dielectric volume, in practice a gas, in which the first electric wire of the breakdown switch component ic1 is immersed, this wire being brought to an increasing voltage very rapidly in the first phase ϕ1. This makes it possible to reduce the jitter between the input voltage pulse $V_{in}$ and the triggering of the test pulse Imp1 by breakdown to values of not more than 1 ns.

Alternatively, according to a variant that is not shown, the light-emitting diode LED is controlled by an external control signal applied between the instant of the input voltage pulse $V_{in}$ and the instant when the output voltage of the transformer T1 is 10% below the spontaneous breakdown voltage of the trigger circuit CD. Advantageously, the external control signal is synchronized with the input voltage pulse $V_{in}$.

Figure 3A:
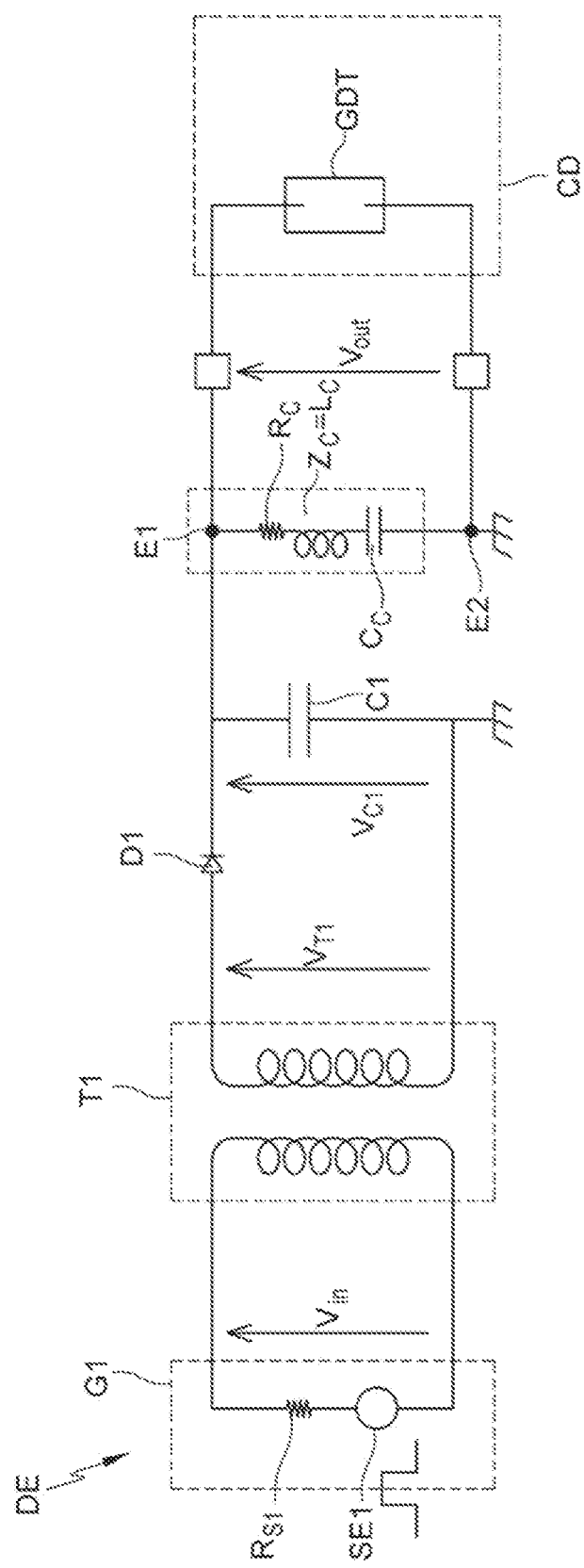
FIG. 3a shows the electrical diagram of the electrical device according to a seventh embodiment of the invention.

FIG. 3a shows the electrical diagram of the electrical device DE according to a seventh embodiment of the invention. The seventh embodiment differs from the fifth embodiment in the implementation of the trigger circuit CD. The trigger circuit CD comprises a gas discharge tube GDT connected in parallel with the target circuit $R_cL_cC_c$. The gas discharge tube GDT is conducting only when the voltage at these terminals exceeds a second predetermined threshold, called the breakdown voltage of the gas discharge tube. The rapid breakdown voltage of the gas discharge tube is between 100 V and 10 kV. Manufacturers specify two breakdown voltages for a gas tube, one for a slow variation rate of 100 V/µs, and the other, which relates to this invention, for a rapid variation rate of 1 V/ns. As the variation rate at the output of the transformer T1 rises, the breakdown voltage increases. Thus it is advantageous to control the slope of the voltage at the output of the transformer T1, in order to control the breakdown threshold of the gas tube. The electrical device DE operates in the same way as the fifth embodiment. The gas discharge tube GDT comprises an encapsulated volume of dielectric gas. The sealed encapsulation prevents fluctuations of the breakdown voltage by isolating the dielectric gas from moisture and the electrodes of the gas discharge tube GDT from oxidation. This provides better control and stability of the breakdown voltage and therefore of the slope of the test pulse, as well as better control of the jitter. This is because the switching time of breakdown by the avalanche effect is of the order of a nanosecond. The switching time is stable and reproducible, meaning that the jitter is entirely determined by the stability of the breakdown voltage. This makes it possible to minimize the jitter of the triggering of the test pulse to values of not more than 1 ns. Furthermore, the service life of the gas tube GDT may be as long as several hundred thousand breakdowns for voltages of not more than 3000 V, and pulse durations reduced to a few nanoseconds, which is sufficient for a test campaign according to the invention.

Figure 3B:
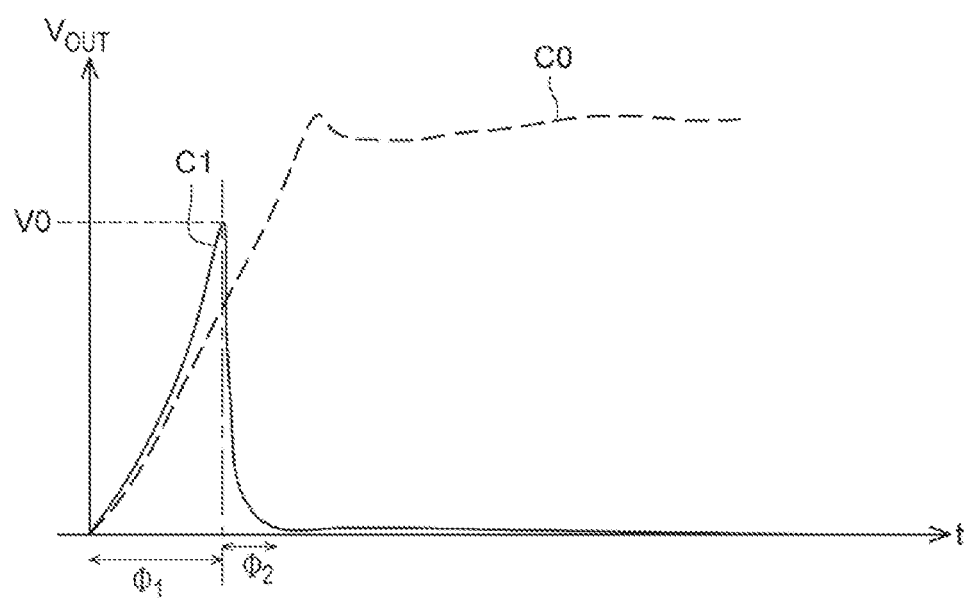
FIG. 3b shows the output voltage of the electrical device according to the seventh embodiment of the invention in the presence or in the absence of a breakdown device.

FIG. 3b shows the output voltage (curve C1) of the electrical device DE according to the seventh embodiment of the invention, compared with the output voltage (curve C0) of a transformer in the absence of a gas discharge tube GDT. Curve C0 shows a plateau of high voltage of the order of 1300 V. This amplitude corresponds to a value of 30% (+/−5%) above the breakdown voltage of the gas discharge tube GDT. By using breakdown it is possible to generate a peak at a voltage of the order of 1000 V, limited in time, with a small jitter, while limiting the exposure of the operator to risk.

Figure 4:
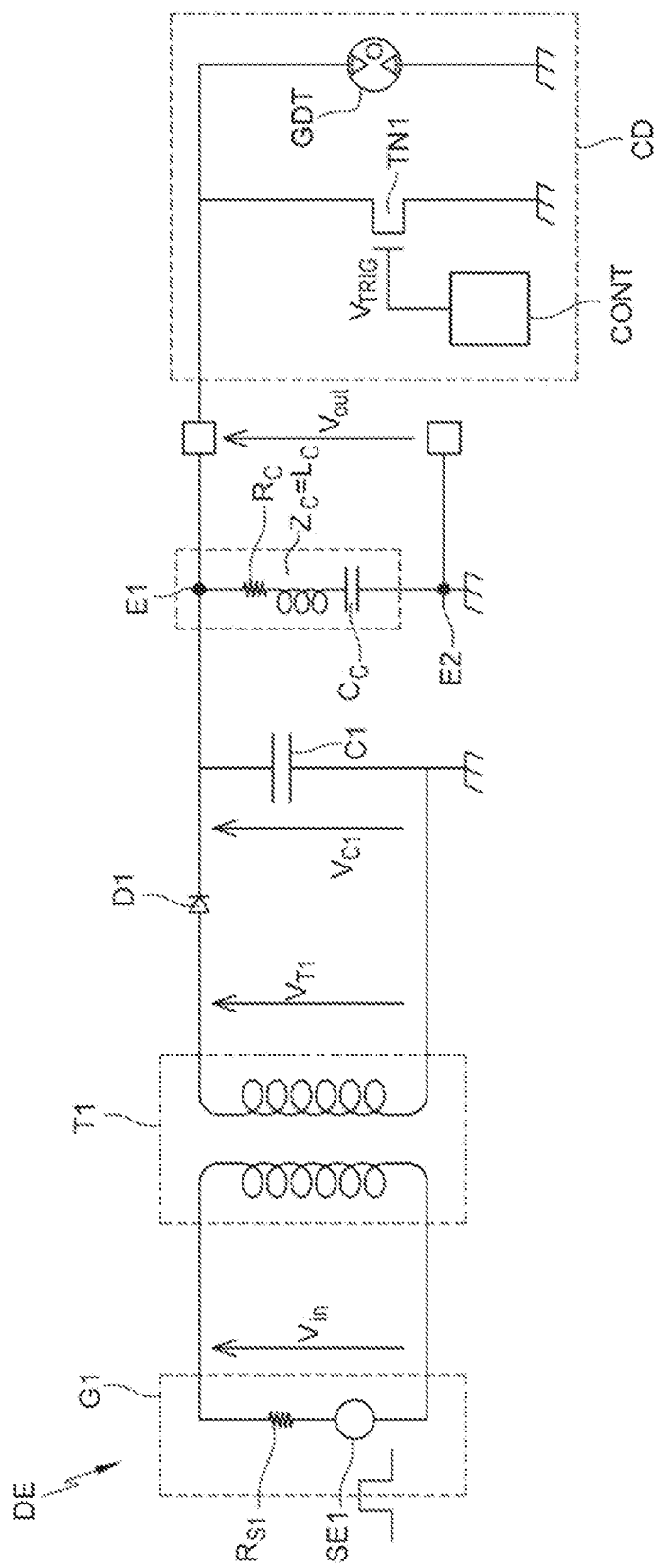
FIG. 4 shows the electrical diagram of the electrical device according to an eighth embodiment of the invention.

FIG. 4 shows the electrical diagram of the electrical device DE according to an eighth embodiment of the invention. The trigger circuit CD combines the gas tube GDT with the transistor TN1 controlled by the control circuit CONT. This makes it possible to provide flexibility between triggering by spontaneous breakdown of the gas tube GDT and triggering controlled via the activation of the transistor TN1.

Alternatively, the trigger circuit CD comprises a plurality of gas tubes $GDT_1$ to $GDT_n$ connected in parallel. The gas tubes $GDT_1$ to $GDT_n$ have breakdown voltages $V0_1$ to $V0_n$ in an increasing order, such that $V0_1 < V0_2 < \ldots < V0_{n-1} < V0_n$; n being a natural integer greater than 1. Thus the first gas tube $GDT_1$ is initially the only one to break down, for a certain number of pulses, because it has the lowest breakdown voltage $V0_1$. After a certain number of breakdowns, the first gas tube $GDT_1$ ages, causing a progressive rise in the breakdown voltage $V0_1$ until it becomes equal to the next breakdown voltage $V0_2$. The two tubes $GDT_1$ and $GDT_2$ switch at the same time and in parallel, thus dividing the current in each tube by two. Their breakdown voltage then increases with erosion by the same mechanism, until it reaches the breakdown voltage of the next gas tube, and so on. This enables the service life of the electrical device DE to be multiplied by the number of gas tubes connected in parallel, relative to a trigger circuit comprising a single gas tube.

Figure 5:
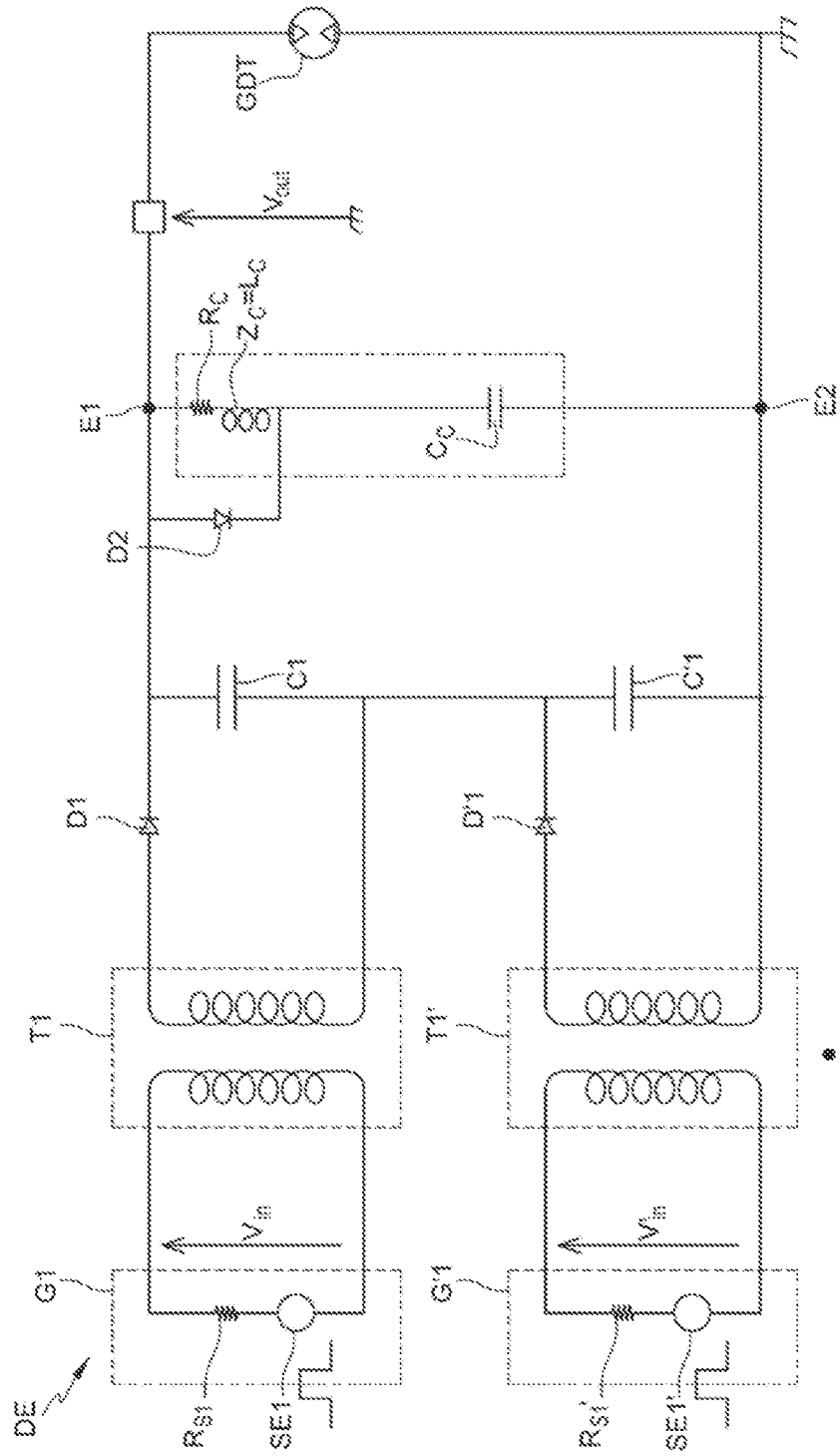
FIG. 5 shows the electrical diagram of the electrical device according to a ninth embodiment of the invention.

FIG. 5 shows the electrical diagram of the electrical device DE according to a ninth embodiment of the invention. The electrical device DE further comprises a second voltage generator G1' configured to generate a second input voltage pulse $V'_{in}$ in a first phase $\phi 1$, simultaneously with the first voltage generator G1. In a similar manner to the first generator G1, the second input voltage pulse $V'_{in}$ is amplified by a second transformer T1' in the same way as that described previously for the first input voltage pulse $V_{in}$. Similarly, the second input signal is rectified by a second rectifier diode D1' on a second storage capacitance C'1. The second storage capacitance C'1 is connected in series with the first storage capacitance C1. The series branch formed by the two storage capacitances C1 and C'1 is connected in parallel with the target circuit $R_c L_c C_c$. This makes it possible to double the voltage and current slope at the moment of breakdown and to attain higher breakdown voltages and currents.

More generally, the assembly formed by the generator G1, the transformer T1, the rectifier diode D1 and the storage capacitance C1 can be duplicated N times. For example, for N=4 with transformers having a transformation ratio N2/N1 of 10, we obtain:

a maximum amplitude of the breakdown voltage V0 of 4 kV;

a slope of the transformer output voltage greater than 25 V/ns;

and a maximum slope of the discharge current into an inductance of 100 nH that may be as much as 40 A/ns.

Figure 6:
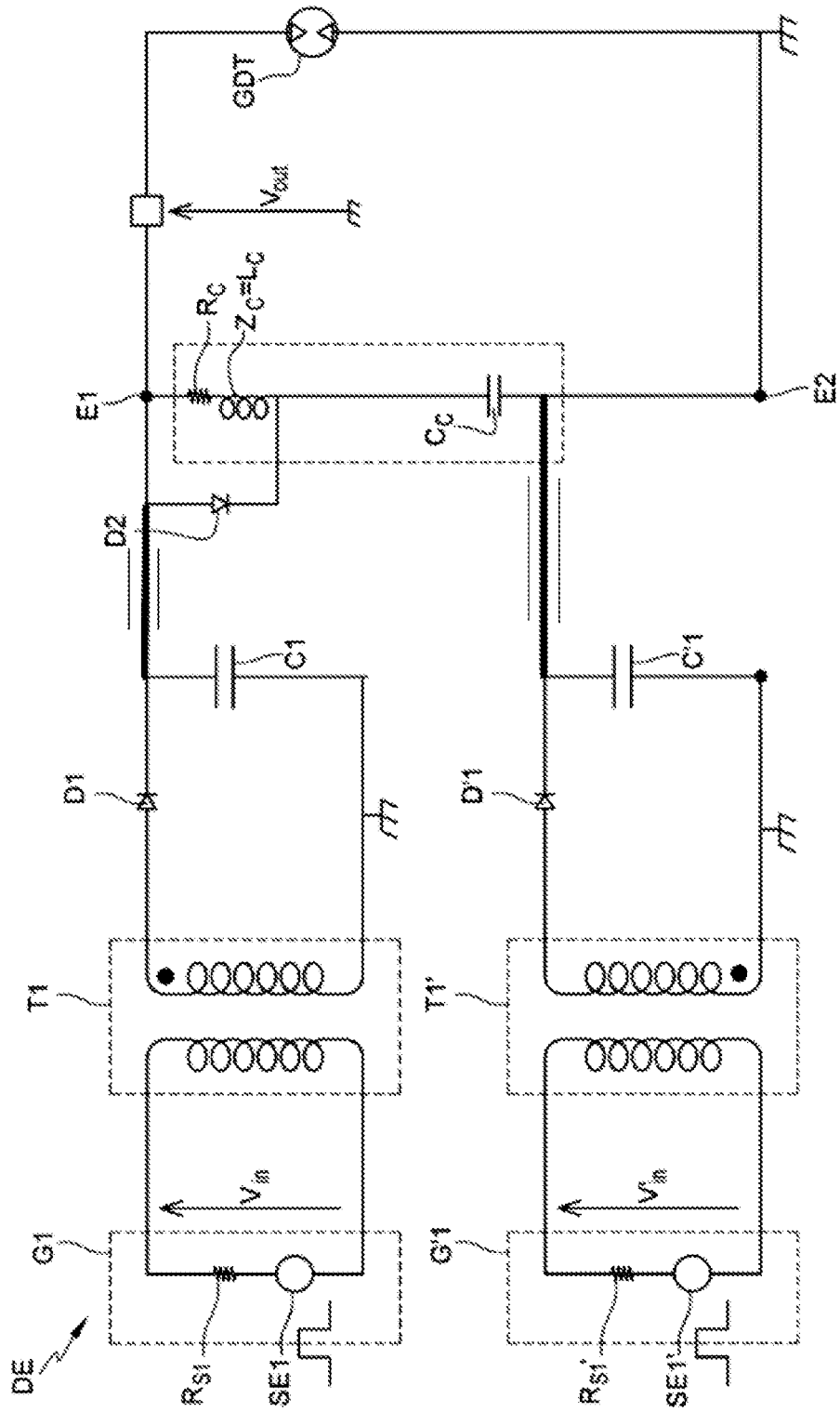
FIG. 6 shows the electrical diagram of the electrical device according to a tenth embodiment of the invention.

FIG. 6 shows the electrical diagram of the electrical device DE according to a tenth embodiment of the invention. According to this embodiment, the electrical device DE comprises a plurality of pulse transformers forming two sets, namely a first set formed by non-inverting transformers and a second set formed by inverting transformers. This embodiment will be described using a non-limiting example in which the electrical device DE comprises two transformers, inverted with respect to each other.

In the illustrated example, the electrical device DE further comprises a second voltage generator G1' configured to generate a second input voltage pulse $V'_{in}$ in a first phase $\phi 1$, simultaneously with the first voltage generator G1. In a similar manner to the first generator G1, the second input voltage pulse $V'_{in}$ is amplified by a second transformer T1' in the same way as that described previously for the first input voltage pulse $V_{in}$. Similarly, the second input signal is rectified by a second rectifier diode D1' on a second storage capacitance C'1. The second storage capacitance C'1 is mounted between the cathode of the rectifier diode D'1 and the electrical ground GND for storing at least some of the electric energy supplied by the secondary winding of the second transformer. The transformers of the second set have a secondary winding (or a primary winding, but not both at once) wound in the opposite direction to the secondary winding of the transformers of the other set. This creates a reverse voltage at the output of a transformer of the first set.

The first transformer T1 is mounted as a non-inverter and thus produces a positive voltage relative to the ground. The electrical potential of the common node between the first storage capacitance C1 and the rectifier diode D1 is positive. The second transformer T1' is mounted as an inverter and thus produces a negative voltage relative to the ground. Thus the electrical potential at the common node between the second storage capacitance C'1 and the rectifier diode D'1 is negative. The alternating fitting is produced as follows: the secondary (or primary) winding of the second transformer T1' is in the inverse direction of the transformer T1. Thus the target circuit sees a positive voltage $+V_p$ on its first electrode E1 and a negative voltage $-V_p$ on its second electrode E2. Thus we obtain a differential voltage of $2V_p$ at the terminals of the target circuit without subjecting the cables and connectors for connection to the target circuit to high voltages. This makes it possible to avoid the breakdown of the connecting cables and other components, while allowing a sufficient voltage to be applied to the terminals of the target circuit and also to the gas discharge tube GDT. It will be recalled that the activation of the gas discharge tube GDT requires the application of high voltages to its terminals. The application of high voltage amplitudes may damage the connectors and cables used, and more particularly coaxial cables. This problem can be overcome by using a differential voltage via two sets of transformers, one set being the inverse of the other, as described for this embodiment. This has the advantage of allowing the size of the cables used to be decreased in terms of diameter (making them less rigid in dielectric and mechanical terms), thus significantly reducing the overall dimensions and weight of the electrical device DE according to the invention.

In the next section, examples of the application of the electrical device according to the invention will be given.

The electrical device DE is, for example, used for a test campaign conducted on an acoustic device comprising a piezoelectric transducer. The target complex impedance Zc is the capacitive element $C_c$ corresponding to the piezoelectric transducer. For example, the capacitance of the element $C_c$ is between 10 pF and 50 nF. The electrical parameter test pulse is a voltage pulse applied to the terminals of the capacitive element $C_c$. The amplitude of the test pulse is greater than 500 V. The variation of the voltage in a rising and/or falling edge of the pulse is between 1 V/ns and 500 V/ns.

The electrical device DE is, for example, used for a test campaign on an electromagnetic device. The target complex impedance Zc is the inductive element Lo configured to operate as a Lorentz force generator. The inductance of the target inductive element $L_c$ is less than 5 nH. The pulse test electrical parameter is the electric current $I_{out}$ through the inductive element $L_c$. The test pulse amplitude is between 1 A and 100 A.

Alternatively, the target complex impedance Zc is the inductive element Lo configured to operate as a magnetic flux generator. The inductance of the inductive element $L_c$ is between 5 nH and 1 µH, or possibly up to 10 µH. The pulse test electrical parameter is the time derivative of the current $dI_{out}/dt$ through the inductive element $L_c$. The test pulse amplitude is between 1 A/ns and 400 A/ns.

The invention claimed is:

1. An electrical device (DE) for connected ingenerating a test pulse of an electrical parameter chosen from among a current ($I_{out}$), a voltage ($V_{out}$) and the time derivative of a current ($dI_{out}/dt$), said electrical device (DE) comprising:
   at least one voltage generator (G1) configured for generating an input voltage pulse ($V_{in}$) in a first phase (φ1);
   for each generator (G1), a coil transformer (T1) for amplifying the input voltage pulse ($V_{in}$), the coil transformer (T1) having a primary winding (T1a) connected in parallel with the associated generator (G1) and a secondary winding (T1b) having a first end and a second end;
   a rectifier diode (D1) having an anode connected to the second end of the secondary winding (T1b) and having a cathode;
   a target circuit ($R_cL_cC_c$) comprising at least one target complex impedance (Zc) and a capacitive element ($C_c$), the target circuit ($R_cL_cC_c$) having a first electrode (E1) connected to the cathode of the rectifier diode (D1) and a second electrode (E2);
   a trigger circuit (CD) configured for triggering a second phase (2) by discharging said capacitive element ($C_c$) through the target circuit ($R_cL_cC_c$) so as to apply the test pulse to the target complex impedance (Zc);
   a storage capacitance (C1) mounted between the cathode of the rectifier diode (D1) and the electrical ground (GND) for storing at least some of the electric energy supplied by the secondary winding (T1b), said storage capacitance (C1) being separate from the capacitive element of the target circuit.

2. The electrical device (DE) as claimed in claim 1, wherein the target circuit ($R_cL_cC_c$) further comprises a resistive element ($R_c$) and an inductive element ($L_c$), both connected in series with the capacitive element ($C_c$), the target complex impedance (Zc) being chosen from among any of said elements.

3. The electrical device (DE) as claimed in claim 2, further comprising a short-circuit diode (D2) connected in parallel with the series formed by the resistive element (Rc) and the inductive element (Lc).

4. The electrical device (DE) as claimed in claim 3, further comprising a Zener diode connected in the reverse direction from the cathode of the rectifier diode (D1), the Zener diode being connected in series with the resistive element (Rc) and the inductive element (Lc), the series formed by the resistive element (Rc) and the inductive element (Lc) and the Zener diode (Dz) being connected in parallel with the short-circuit diode (D2).

5. The electrical device (DE) as claimed in claim 2, wherein:
   the target complex impedance (Zc) is the capacitive element ($C_c$) corresponding to a piezoelectric transducer;
   the electrical parameter is the voltage ($V_{out}$) at the terminals of the capacitive element ($C_c$);
   the test pulse amplitude is greater than 250 V; the variation of the voltage during a rising and/or falling edge of the pulse is between 1 V/ns and 500 V/ns.

6. The electrical device (DE) as claimed in claim 2, wherein:
   the target complex impedance (Zc) is the inductive element (Lc) corresponding to a Lorentz force generator;
   the inductance of the target inductive element ($L_c$) is less than 5 nH;
   the electrical parameter is the electric current ($I_{out}$) through the inductive element ($L_c$);
   the test pulse amplitude is between 1 A and 100 A.

7. The electrical device (DE) as claimed in claim 2, wherein:
   the target complex impedance (Zc) is the inductive element ($L_c$) corresponding to a magnetic flux generator;
   the inductance of the inductive element ($L_c$) is between 5 nH and 1 µH;
   the electrical parameter is the time derivative of the current ($dI_{out}/dt$) through the inductive element ($L_c$);
   the test pulse amplitude is between 1 A/ns and 400 A/ns.

8. The electrical device (DE) as claimed in claim 1, wherein the trigger circuit (CD) comprises:
   a trigger transistor (TN1) connecting the second electrode (E2) to the electrical ground (GND);
   control means (CONT) configured to generate a trigger signal ($V_{TRIG}$) for keeping the trigger transistor (TN1) in the blocking state during the first phase (φ1), and for putting the trigger transistor (TN1) in the conducting state during the second phase (φ2), so as to activate the discharge of the storage capacitance (C1) into the complex impedance (Zc).

9. The electrical device (DE) as claimed in claim 1, wherein the trigger circuit (CD) comprises:
   a trigger transistor (TN1) connecting the first electrode (E1) to the electrical ground (GND), the second electrode being connected to the electrical ground (GND);
   control means (CONT) configured to generate a trigger signal ($V_{TRIG}$) for keeping the trigger transistor (TN1) in the blocking state during the first phase (φ1), and for putting the trigger transistor (TN1) into the conducting state during the second phase (φ2), so as to activate the discharge of the capacitive element (C1) into the target complex impedance (Zc).

10. The electrical device (DE) as claimed in claim 1, wherein the trigger circuit (CD) further comprises a breakdown switch component (ic1) comprising:
   a first conducting wire connected to the first electrode (E1) of the complex load impedance (Zc);
   a second conducting wire connected to the second electrode (E2) of the complex load impedance (Zc);
   the first and second conducting wires being separated at a first distance (d1) of not more than 1 mm by a dielectric volume, the breakdown switch component (ic1) being conducting only when the voltage between the first conducting wire and the second conducting wire exceeds a first predetermined threshold, the first predetermined threshold depending on the first distance (d1).

11. The electrical device (DE) as claimed in claim 10, wherein the breakdown switch component (ic1) further comprises an adjusting micro-screw fixed to the second conducting wire for controlling the first distance (d1).

12. The electrical device (DE) as claimed in claim 10, wherein the trigger circuit (CD) further comprises:
   a metallic layer (ML1) placed at a second distance (d2) from the dielectric volume, the second distance being not more than 1 mm;
   a light-emitting diode (LED) connected between the generator (G1) and the electrical ground (GND) and placed so as to emit a light ray onto the metallic layer (ML1) when the input voltage pulse ($V_{in}$) is generated.

13. The electrical device (DE) as claimed in claim 1, wherein the trigger circuit (CD) further comprises a gas discharge tube (GDT) connected in parallel with the target circuit ($R_c L_c C_c$); the gas discharge tube (GDT) is conducting only when the voltage at these terminals is above a second predetermined threshold.

* * * * *

UNITED STATES PATENT AND TRADEMARK OFFICE
CERTIFICATE OF CORRECTION

PATENT NO. : 12,289,109 B2
APPLICATION NO. : 18/391290
DATED : April 29, 2025
INVENTOR(S) : Jean-Pierre Nikolovski et al.

Page 1 of 1

It is certified that error appears in the above-identified patent and that said Letters Patent is hereby corrected as shown below:

In the Claims

In Claim 1, Column 13, Line 47, "a second phase (2)" should be -- a second phase ($\phi 2$) --.

Signed and Sealed this
Twenty-fourth Day of June, 2025

Coke Morgan Stewart
*Acting Director of the United States Patent and Trademark Office*